(12) United States Patent
Li et al.

(10) Patent No.: US 7,651,831 B2
(45) Date of Patent: Jan. 26, 2010

(54) POSITIVE PHOTORESIST COMPOSITION WITH A POLYMER INCLUDING A FLUOROSULFONAMIDE GROUP AND PROCESS FOR ITS USE

(75) Inventors: Wenjie Li, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/136,163

(22) Filed: Jun. 10, 2008

(65) Prior Publication Data

US 2008/0233514 A1 Sep. 25, 2008

Related U.S. Application Data

(63) Continuation of application No. 11/438,842, filed on May 23, 2006, which is a continuation-in-part of application No. 10/753,989, filed on Jan. 8, 2004, now Pat. No. 7,063,931.

(51) Int. Cl.
*G03F 7/004* (2006.01)
*G03F 7/30* (2006.01)

(52) U.S. Cl. .................... 430/270.1; 430/326; 430/905; 430/907; 430/910

(58) Field of Classification Search ............. 430/270.1, 430/326, 905, 907, 910
See application file for complete search history.

(56) References Cited

U.S. PATENT DOCUMENTS

| 6,165,678 | A | * | 12/2000 | Allen et al. | ............... 430/270.1 |
| 6,177,228 | B1 | | 1/2001 | Allen et al. | |
| 6,235,849 | B1 | | 5/2001 | Jayaraman et al. | |
| 6,420,503 | B1 | | 7/2002 | Jayaraman et al. | |
| 6,706,826 | B1 | * | 3/2004 | Fujiwara et al. | ............... 526/79 |
| 6,824,956 | B2 | | 11/2004 | Sato | |
| 6,949,325 | B2 | * | 9/2005 | Li et al. | .................... 430/270.1 |
| 7,189,490 | B2 | * | 3/2007 | Kanagasabapathy et al. | ..... 430/270.1 |
| 7,335,456 | B2 | * | 2/2008 | Li et al. | .................... 430/270.1 |

FOREIGN PATENT DOCUMENTS

| EP | 1074566 A1 | 7/2001 |
| JP | 2003-241381 | 8/2003 |

* cited by examiner

*Primary Examiner*—John S Chu
(74) *Attorney, Agent, or Firm*—Steven Capella

(57) ABSTRACT

A positive photoresist composition comprises a radiation sensitive acid generator, and a polymer that includes a first repeating unit derived from a sulfonamide monomer including a fluorosulfonamide functionality, a second repeating unit having a pendant acid-labile moiety, and a third repeating unit having a lactone functionality. The positive photoresist composition may be used to form patterned features on a substrate, such as those used in the manufacture of a semiconductor device.

16 Claims, 1 Drawing Sheet

POSITIVE PHOTORESIST COMPOSITION WITH A POLYMER INCLUDING A FLUOROSULFONAMIDE GROUP AND PROCESS FOR ITS USE

CROSS REFERENCE TO RELATED APPLICATIONS

This application is a continuation of the U.S. patent application Ser. No. 11/438,842, filed May 23, 2006 which is a continuation-in-part of U.S. patent application Ser. No. 10/753,989, filed Jan. 8, 2004, now U.S. Pat. No. 7,063,931, the disclosure of which is incorporated herein by reference.

BACKGROUND OF THE INVENTION

1. Field of the Invention

The present invention relates to a photoresist composition and, more particularly, to a positive photoresist composition that comprises a polymer comprising a first repeating unit derived from a sulfonamide monomer including a fluorosulfonamide functionality.

2. Description of the Related Art

In the manufacture of semiconductors, the photolithographic process typically projects an ultraviolet (UV) light onto a semiconductor substrate coated with a layer of a photosensitive resist, i.e., a photoresist, through a mask that defines a particular pattern of electronic circuitry. Exposure to UV light, followed by baking, induces a photochemical reaction, which changes the solubility of the exposed regions of the photoresist. Thereafter, an appropriate developer, typically an aqueous base solution, is used to selectively remove the photoresist in the exposed regions or alternatively, in the unexposed regions, to create a patterned imaging layer. A photoresist that is removed from the exposed regions is called a positive photoresist, while a photoresist that is removed from the unexposed regions is called a negative photoresist. The patterned imaging layer typically overlies the semiconductor substrate, which may now be processed by another semiconductor manufacturing process, for example, etching or ion implantation, to create patterned processing of the now revealed semiconductor substrate.

Photoresists are generally comprised of a polymeric matrix, a radiation sensitive component, a casting solvent, and other performance enhancing additives. The polymeric matrix should have a reasonable absorption at exposure wavelengths. Another parameter to be considered in new photoresist materials is the dissolution behavior of the material in a given developer. The semiconductor industry has largely supported the use of 0.263 N tetramethyl ammonium hydroxide (TMAH) as a developer for photoresists.

In order to achieve the desired photolithographic performance, a positive photoresist should not swell upon contact with a developer and ideally, should show but slight dissolution (0-1 nm/s) in the developer before irradiation. After irradiation, positive photoresists in exposed regions should have a high dissolution rate in the developer, so that they can be easily removed and so subsequent processing is limited to the desired pattern.

To achieve the desired dissolution properties in an aqueous base developer, acidic groups are incorporated into the polymer structure. In photoresists exposed to light of a 248 nm wavelength, hydroxystyrene has been widely used as an acidic group. Hydroxystyrene, however, strongly absorbs light of a 193 nm wavelength, which is currently used in irradiating processes, and it is anticipated that irradiation processes will use even shorter wavelengths in the near future in order to enhance resolution. Instead, when using light of a 193 nm wavelength for exposure, acidic groups such as carboxylic acid (—COOH) and hexafluoroalcohol (HFA) are currently used. However, COOH is a relatively strong acidic group and has a strong affinity for a base developer. Polymers with COOH tend to swell and/or quickly dissolve in an aqueous base developer. Thus, it is difficult to achieve slight dissolution in the developer before irradiation with polymers having COOH acidic groups. The HFA acidic group is much weaker than COOH. Thus, photoresists based on HFA tend to have better dissolution properties. However, due to the high fluorine content in the HFA group, the etch resistance is often a concern.

Thus, there remains a need for a positive photoresist composition that exhibits an excellent dissolution response in an aqueous base developer, and yet overcomes the above-mentioned problems associated with photoresist compositions.

SUMMARY OF THE INVENTION

The invention provides a positive photoresist compositions incorporating fluorosulfonamide functionality. The photoresist compositions of the invention preferably have a combination of good etch resistance and dissolution properties (e.g., a slight dissolution in the unexposed areas of positive photoresist and a fast dissolution in the exposed areas of positive photoresist).

In one aspect, the invention encompasses a positive photoresist composition that comprises a radiation sensitive acid generator and a polymer, where the polymer comprises:

a first repeating unit derived from a fluorosulfonamide monomer including one of the following structures,

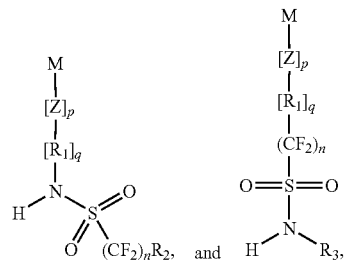

in which M is a polymerizable backbone moiety, Z comprises a linking moiety comprising one of —C(O)O—, —C(O)—, —OC(O)—, —O—C(O)—C(O)—O—, $R_1$ represents one of an alkylene, a cycloalkylene, an arylene, a semi- or perfluorinated alkylene, a semi- or perfluorinated cycloalkylene, and a semi- or perfluorinated arylene, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl;

ii) a second repeating unit including a pendant acid-labile moiety, and a repeating unit including a lactone moiety.

The polymer preferably contains about 5-40 mole % of said repeating unit i). The polymerizable backbone moiety, M, preferably includes one of the following structures,

where $R_4$ represents one of hydrogen, an alkyl group of 1 to 20 carbons, a semi- or perfluorinated alkyl group of 1 to 20 carbons, and CN, and

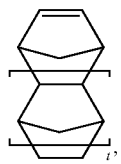

where t is an integer from 0 to 3.

In another aspect, the present invention encompasses a method of making a patterned structure on a substrate. The method includes depositing a positive photoresist composition of the invention on the substrate to form a positive photoresist layer, exposing the positive photoresist layer to a pattern of imaging radiation, removing a portion of the positive photoresist layer that is exposed to the pattern of imaging radiation to reveal a pattern of the substrate, which corresponds to the pattern of imaging radiation, and subsequently transferring the pattern to the substrate.

These and other aspects of the invention are described in further detail below.

BRIEF DESCRIPTION OF THE DRAWINGS

The foregoing and other exemplary aspects of the present invention will be better understood from the following detailed description of exemplary embodiments of the present invention with reference to the FIGURE in which.

DETAILED DESCRIPTION OF THE INVENTION

Figure 1:
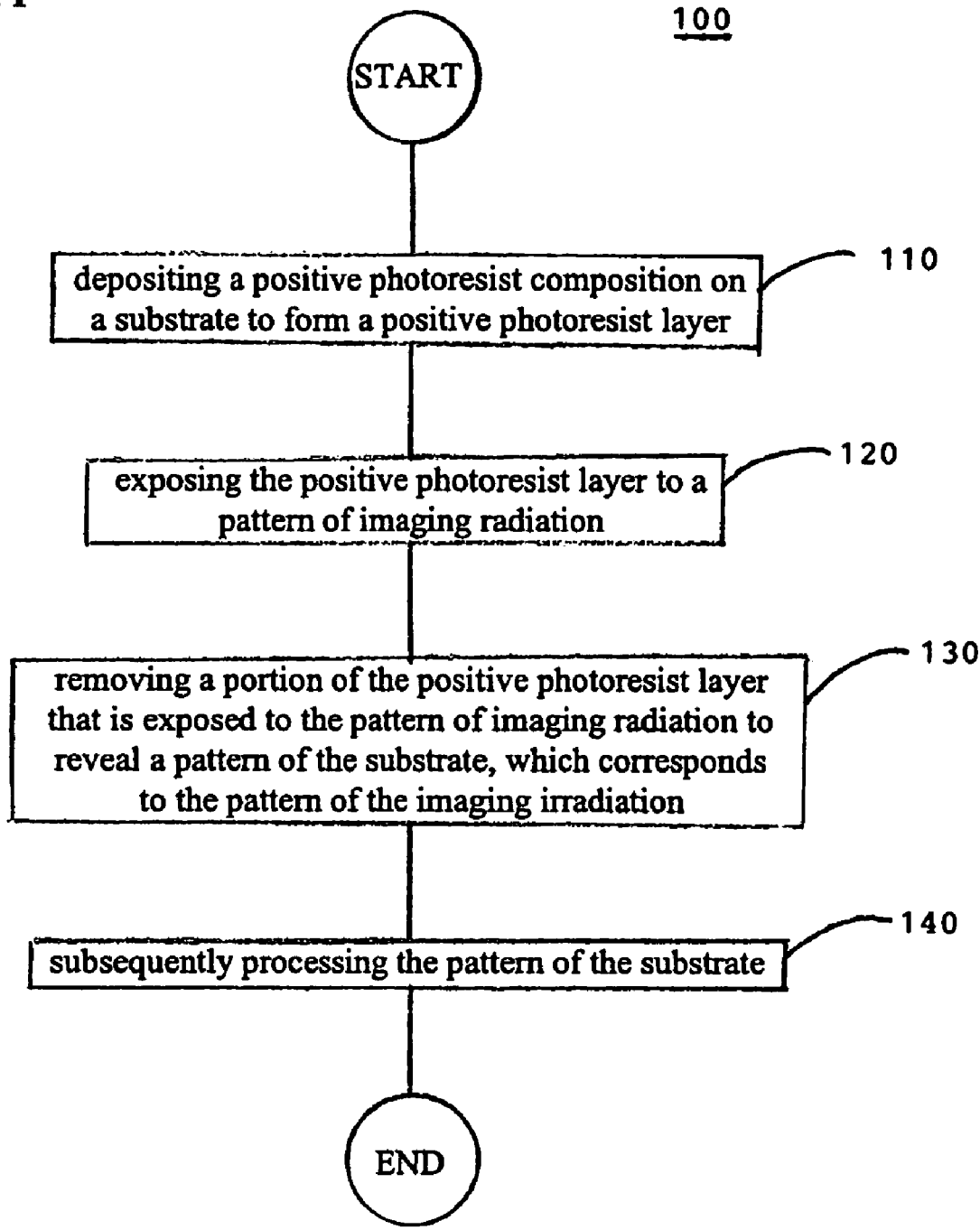
FIG. 1 provides a flowchart 100 that illustrates a method of making a patterned photoresist layer on a substrate for subsequent processing of a correspondingly patterned substrate in an exemplary embodiment of the present invention.

Generally, photoresists may comprise a polymeric matrix, a radiation sensitive component such as, for example, a radiation sensitive acid generator, a solvent, and other performance enhancing additives, for example, a quencher, and a surfactant.

The invention encompasses a positive photoresist composition that comprises a polymer that may form a polymeric matrix, where the polymer comprises i) a first repeating unit derived from a sulfonamide monomer including a fluorosulfonamide functionality, ii) a second monomer unit, including a pendant acid labile group, and iii) a third monomer unit including a pendant lactone group.

The first repeating unit of the polymer is preferably derived from a fluorosulfonamide monomer including one of the following two structures:

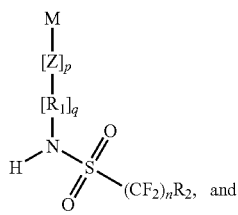

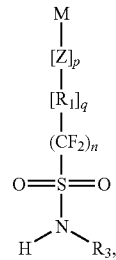

in which M is a polymerizable backbone moiety, Z is a linking moiety comprising one of —C(O)O—, —C(O)—, —OC(O)—, —O—C(O)—C(O)—O—, $R_1$ represents one of an alkylene, a cycloalkylene, an arylene, a semi- or perfluorinated alkylene, a semi- or perfluorinated cycloalkylene, and a semi- or perfluorinated arylene, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl.

Examples of the polymerizable backbone moiety, M, may include:

where $R_4$ represents hydrogen, a linear or branched alkyl group of 1 to 20 carbons, a semi- or perfluorinated linear or branched alkyl group of 1 to 20 carbons, or CN; and

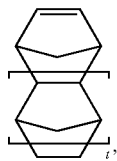

where t is an integer from 0 to 3.

More preferably, the first repeating unit of the polymer is preferably derived from a monomer selected from the group consisting of:

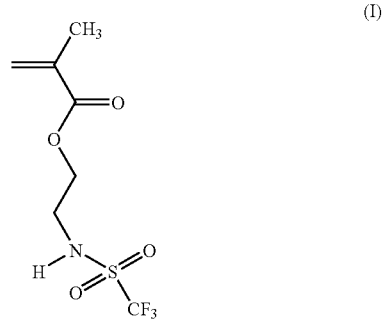

-continued (II)
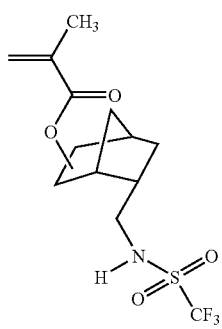

(III)
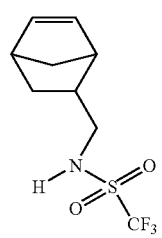

(IV)
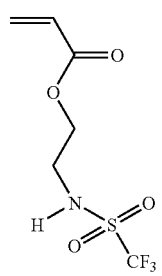

(V)
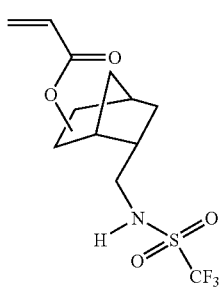

(VI)
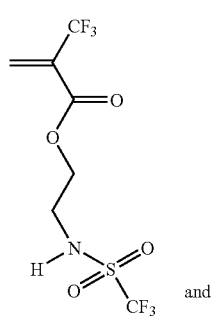
and (VII)
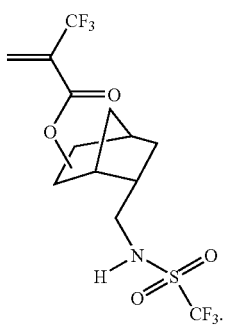

The polymer preferably contains about 5-40 mole % of said repeating unit i), more preferably about 15-30 mole %.

The second repeating unit is derived from a monomer which includes acid-labile pendant moieties, such as tertiary alkyl carbonates, tertiary alkyl esters, tertiary alkyl ethers, acetals, and ketals. The acid-labile moieties preferably act to inhibit dissolution of the photoresist composition in aqueous alkaline developer. Some examples of such a monomer including a tertiary alkyl ester are shown below:

(VIII)
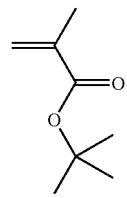

(IX)
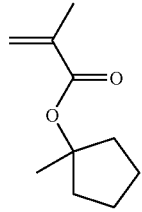

(X)
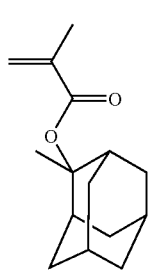

(XI)
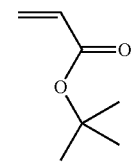

-continued
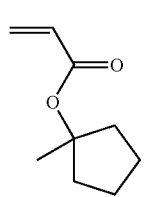  (XII)
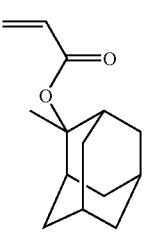  (XIII)
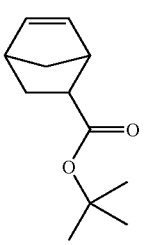  (XIV)
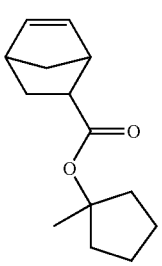  (XV)
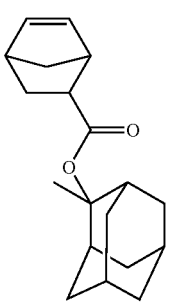  (XVI)
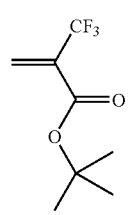  (XVII)
-continued
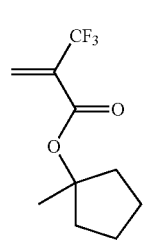  (XVIII)
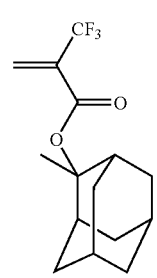  (XIX)
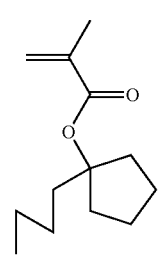  (XX)
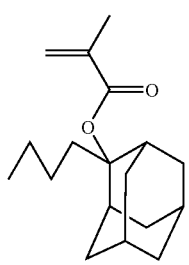  (XXI)
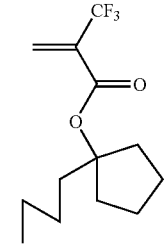  (XXII)
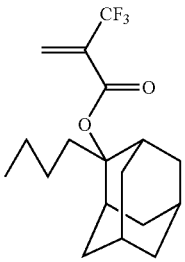  (XXIII)

-continued (XXIV)
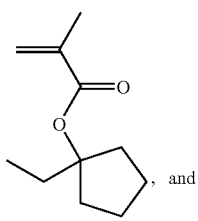, and (XXV)
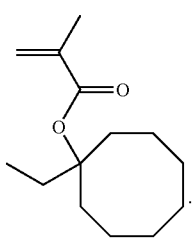.

The photoresist compositions of the invention are not limited to any specific form of the second repeating unit. The polymer of the invention preferably includes about 20-60 mole % of the second repeating unit, more preferably about 30-50 mole %.

The third repeating unit of the polymer contains a lactone functionality. Some examples of the third repeating unit are derived from monomers having the following structures:

(XXVI)
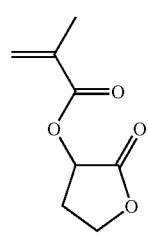

(XXVII)
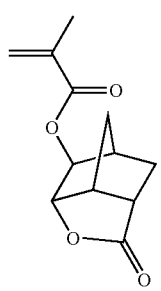

(XXVIII)
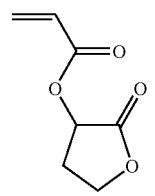

-continued (XXIX)
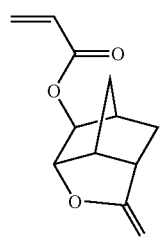

(XXX)
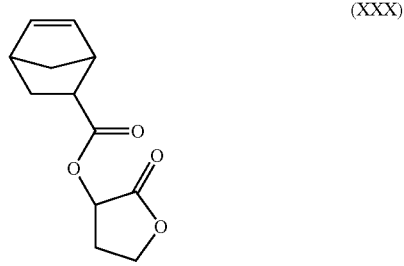

(XXXI)
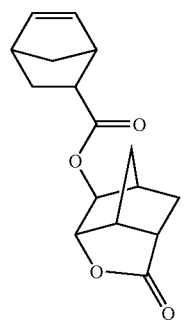

(XXXII)
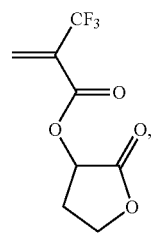

(XXXIII)
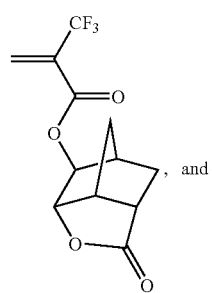, and

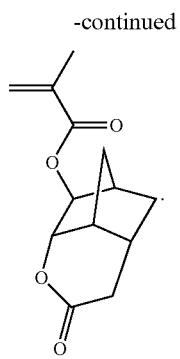

(XXXIV)

The photoresist compositions of the invention are not limited to any specific form of the third repeating unit. The polymer of the invention preferably includes about 30-50 mole % of the second repeating unit, more preferably about 35-45 mole %.

The radiation sensitive acid generators, also known as photoacid generators, used in the photoresist composition of the invention are compounds that generate an acid upon exposure to radiation. Any suitable photoacid generating agent may be used, so long as the resulting photoresist composition dissolves sufficiently in an organic solvent and the resulting solution thereof forms a suitably uniform film by a film-forming process, such as spin coating or the like. Some examples of classes of photoacid generators that may be employed in compositions of the invention are: onium salts, succinimide derivatives, diazo compounds, nitrobenzyl compounds, and the like. To minimize acid diffusion for high resolution capability, the photoacid generators may be such that they generate bulky acids upon exposure to radiation. Such bulky acids may include at least 4 carbon atoms. The photoacid generators may be used singly or in a mixture of two or more.

Preferred photoacid generators are onium salts, such as an iodonium salt or a sulfonium salt, and/or a succinimide derivative. More preferred photoacid generators include 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-utoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl)iodonium perfluorohexane sulfonate, di(t-butylphenyl)iodonium perfluoroethylcyclohexane sulfonate, di(t-butylphenyl)iodonium camphorsulfonate, and perfluorobutylsulfonyloxybicylo[2.2.1]-hept-5-ene-2,3-dicarboximide.

The specific photoacid generator selected will depend on the irradiation being used for patterning the photoresist. Photoacid generators are currently available for a variety of different wavelengths of light from the visible range to the X-ray range; thus, imaging of the photoresist can be performed using deep-UV, extreme-UV, e-beam, laser, or any other selected irradiation source that is deemed useful. The compositions of the invention preferably contain photoacid generators suitable for lithographic processes using 193 nm imaging radiation.

The positive photoresist composition of the present invention may further comprise a solvent, and other additives such as quenchers or surfactants.

Any suitable solvent may be employed in the photoresist composition of the invention. Such solvents act to dissolve the fluorosulfonamide-containing polymer and other components of the photoresist composition. Illustrative examples of such solvents may include, but are not limited to: ethers, glycol ethers, aromatic hydrocarbons, ketones, esters and the like. Preferred solvents may include propylene glycol, monomethyl ether acetate, ethyl lactate, γ-butyrolactone, and cyclohexanone. Any of these solvents may be used singly or in a mixture of two or more. The invention is not limited to the use of any specific solvent.

The quencher that may be used in the photoresist composition of the invention may comprise a weak base that scavenges trace acids, while not having an excessive impact on the performance of the positive photoresist. Illustrative examples of such quenchers may include aromatic or aliphatic amines, such as 2-phenylbenzimidazole, or t-alkyl ammonium hydroxides, such as t-butyl ammonium hydroxide (TBAH). The invention is not limited to the use of any specific quencher.

The surfactants, which may be used in the photoresist composition of the invention, may improve the coating homogeneity of the positive photoresist compositions of the invention. Illustrative examples of such surfactants may include fluorine-containing surfactants, such as 3M's FC-430®, siloxane-containing surfactants such as Union Carbide's SIL-WET® series, and the like. The invention is not limited to the use of any specific surfactant.

The photoresist compositions of the invention preferably comprise:
about 1 to about 30 wt. % of the polymer including a fluorosulfonamide functionality, more preferably about 5 to about 15 wt. %;
about 0.5 to about 20 wt. % of photoacid generator, based on the total weight of the polymer, more preferably about 0.5 to about 10 wt. %; and
a solvent, which may typically be present in amounts of about 70 to about 99 wt. % of the composition, more preferably about 85 to about 95 wt. %.

The photoresist composition may further comprise a quencher, which may typically be present in amounts of about 0.1 to about 1.0 wt. % based on the total weight of the polymer, and a surfactant, which may typically be present in amounts of about 0.001 to about 0.1 wt. % based on the total weight of the polymer.

The positive photoresist compositions of the invention may be used as an imaging layer in the manufacture of semiconductor devices. The positive photoresist may be applied by means well known in the art, such as spin-coating, to a selected substrate. The selected substrate upon which the positive photoresist is applied, may then preferably be baked (pre-exposure bake) to remove the solvent and to improve the coherence of the photoresist imaging layer. A typical pre-exposure baking temperature may be about 80° C. to about 150° C. and a typical photoresist thickness may be about 100 nm to about 500 nm.

The positive photoresist layer may be exposed through a patterned mask to an appropriate irradiation source. Exposure to the appropriate irradiation source may be followed by a post-exposure baking and subsequent development of the photoresist imaging layer in an aqueous base developer, for example, 0.263 N TMAH developer, which removes those portions of the positive photoresist that have been exposed to the irradiation source to form the pattern of the photoresist imaging layer. The compositions of the invention are especially useful in lithographic processes using 193 nm imaging radiation.

The pattern of the photoresist imaging layer comprises areas from which a portion of the photoresist layer has been removed and areas, where the remaining portion of the photoresist layer has not been removed. Where the portion of the photoresist layer has been removed, an underlying substrate material, for example, an antireflective layer, a semiconductor, a dielectric, a conductor, a ceramic, etc., is revealed, such that the revealed substrate material corresponds to the pattern of the photoresist imaging layer. This revealed pattern of substrate material is now available for pattern transfer, such as, for example, etching or ion implantation at the exposed areas of the substrate. Thus, the positive photoresist composition may be used to create a patterned underlying substrate material structure, such as a metal wiring line, a hole for a contact or a via, an insulating structure, e.g., a damascene trench or a shallow isolation trench, or a trench for use in a capacitive structure, etc. that may be used in the manufacture of a semiconductor integrated circuit.

FIG. 1 is a flow chart 100 that outlines a method of making a positive photoresist layer on a substrate including depositing a positive photoresist composition on a substrate to form a positive photoresist layer 110, exposing the positive photoresist layer to a pattern of imaging radiation 120, removing a portion of the positive photoresist layer that is exposed to the pattern of imaging radiation 130, and revealing a pattern on the substrate, which corresponds to the pattern of imaging radiation, for subsequent processing 140 (e.g., pattern transfer at exposed spaces of the substrate corresponding to the pattern).

The following examples are provided to further illustrate the present invention. The invention is not limited to the specific details of these examples.

EXAMPLE 1

Synthesis of Poly(I-co-X-co-XXVII)

0.2 g (0.0012 mol) of 2,2'-azobisisobutyronitrile (AIBN) was added to a solution of 1.57 g (0.006 mol) of 2-trifluoromethanesulfonylaminoethyl methacrylate (I), 4.21 g (0.018 mol) of 2-methyl-2-adamantyl methacrylate (X), 3.55 g (0.016 mol) of 5-methacryloyloxy-2,6-norbornanecarbo-γ-lactone (XXVII) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 2

Synthesis of Poly(I-co-X-co-XXVII)

0.2 g (0.0012 mol) of 2,2'-azobisisobutyronitrile (AIBN) was added to a solution of 3.13 g (0.012 mol) of 2-trifluoromethanesulfonylaminoethyl methacrylate (I), 2.81 g (0.012 mol) of 2-methyl-2-adamantyl methacrylate (X), 3.55 g (0.016 mol) of 5-methacryloyloxy-2,6-norbornanecarbo-γ-lactone (XXVII) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 3

Synthesis of Poly(I-co-XXV-co-XXVII)

0.2 g (0.0012 mol) of 2,2'-azobisisobutyronitrile (AIBN) was added to a solution of 1.57 g (0.006 mol) of 2-trifluoromethanesulfonylaminoethyl methacrylate (I), 4.03 g (0.018 mol) of ethylcyclooctyl methacrylate (XXV), 3.55 g (0.016 mol) of 5-methacryloyloxy-2,6-norbornanecarbo-γ-lactone (XXVII) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 4

Synthesis of Poly(II-co-X-co-XXVII)

0.2 g (0.0012 mol) of 2,2'-azobisisobutyronitrile (AIBN) was added to a solution of 1.96 g (0.006 mol) of trifluoromethanesulfonylaminomethyl norbornyl methacrylate (II), 4.21 g (0.018 mol) of 2-methyl-2-adamantyl methacrylate (X), 3.55 g (0.016 mol) of 5-methacryloyloxy-2,6-norbornanecarbo-γ-lactone (XXVII) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 5

Synthesis of Poly(II-co-X-co-XXXIV)

0.2 g (0.0012 mol) of 2,2'-azobisisobutyronitrile (AIBN) was added to a solution of 1.96 g (0.006 mol) of trifluoromethanesulfonylaminomethyl norbornyl methacrylate (II), 4.21 g (0.018 mol) of 2-methyl-2-adamantyl methacrylate (X), 3.78 g (0.016 mol) of 5-methacryloyloxy-2,6-norbornanecarbo-δ-lactone (XXXIV) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 6

Lithographic Evaluation

For the purpose of evaluative lithographic experiments, a photoresist formulation containing Poly(I-co-X-co-XXVII)

(Example 1) was prepared by combining the materials set forth below, expressed in part by weight.

| | |
|---|---|
| Propylene glycol monomethyl ether acetate | 90 |
| Poly(I-co-X-co-XXVII) | 9.50 |
| 4-(1-Butoxynaphthyl)tetrahydrothiophenium perfluorooctanesulfonate | 0.475 |
| 2-Phenylbenzimidazole | 0.025 |

The prepared photoresist formulation was spin-coated for 30 seconds onto an antireflective material (AR40, Shipley Company) layer applied on silicon wafers. The photoresist layer was soft-baked at 130° C. for 60 seconds on a vacuum hot plate to produce a film thickness of about 0.24 μm. The wafers were then exposed to 193 nm radiation (ASML scanner, 0.75 NA). The exposure pattern was an array of lines and spaces of varying dimensions down to 0.09 μm. The exposed wafers were post-exposure baked on a vacuum hot plate at 130° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 110 nm, i.e., 0.11 μm, and above were readily distinguished and appeared sharply defined with little or no blurring.

EXAMPLE 7

Lithographic Evaluation

For the purpose of evaluative lithographic experiments, a photoresist formulation containing Poly(II-co-X-co-XXXIV) (Example 5) was prepared by combining the materials set forth below, expressed in part by weight.

| | |
|---|---|
| Propylene glycol monomethyl ether acetate | 90 |
| Poly(II-co-X-co-XXXIV) | 9.50 |
| 4-(1-Butoxynaphthyl)tetrahydrothiophenium perfluorooctanesulfonate | 0.475 |
| 2-Phenylbenzimidazole | 0.025 |

The prepared photoresist formulation was spin-coated for 30 seconds onto an antireflective material (AR40, Shipley Company) layer applied on silicon wafers. The photoresist layer was soft-baked at 110° C. for 60 seconds on a vacuum hot plate to produce a film thickness of about 0.24 μm. The wafers were then exposed to 193 nm radiation (ASML scanner, 0.75 NA). The exposure pattern was an array of lines and spaces of varying dimensions down to 0.09 μm. The exposed wafers were post-exposure baked on a vacuum hot plate at 120° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 110 nm, i.e., 0.11 μm, and above were readily distinguished and appeared sharply defined with little or no blurring.

While the invention has been described in terms of exemplary embodiments, those skilled in the art will recognize that the present invention may be practiced with modifications within the spirit and scope of the appended claims. Further, it is noted that Applicants' intent is to encompass equivalents of all claim elements, even if amended later during prosecution.

What is claimed is:

1. A positive photoresist composition comprising:

a radiation sensitive acid generator: and a polymer, the polymer comprising:

(i) a first repeating unit derived from a fluorosulfonamide monomer including one of the following two structures,

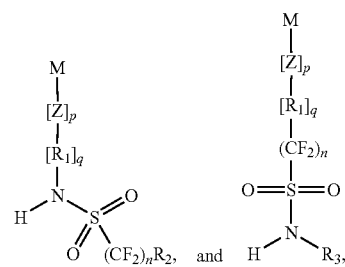

in which M comprises a poymerizable backbone moiety, Z comprises a linking moiety comprising one of —C(O)O—, —C(O)—, 13 OC(O)—, —O—C(O)—C(O)—O—, $R_1$ represents one of an akylene, a cycloalkylene, an arylene, a semi- or perfluorinated alkylene, a semi- or perfluorinated cycloalkylene, and a semi- or perfluorinated arylene, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl, and ii) a second repeating unit including a pendant acid-labile moiety, and iii) a repeating unit including a lactone moiety;

and said polymer contains about 15-30 mole % of said repeating unit i), about 30-50 mole % of said repeating unit ii), and about 35-45 mole % of said repeating unit iii).

2. The positive photoresist composition of claim 1, wherein the polymerizable backbone moiety, M, includes one of the following structures,

where $R_4$ represents one of hydrogen, an alkyl group of 1 to 20 carbons, a semi- or perfluorinated alkyl group of 1 to 20 carbons, and CN, and

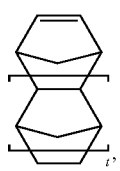

where t is an integer from 0 to 3.

3. The positive photoresist composition of claim 1, wherein said fluorosulfonamide monomer comprises one of the following structures:

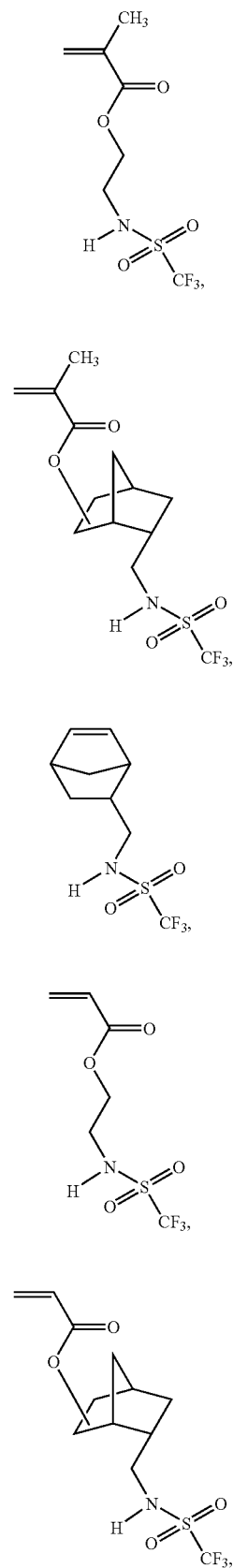

4. The positive photoresist composition of claim 1, wherein the second repeating unit ii) including the acid-labile pendant moiety comprises one of a tertiary alkyl carbonate, a tertiary alkyl ester, a tertiary alkyl ether, an acetal and a ketal.

5. The positive photoresist composition of claim 4, wherein the tertiary alkyl ester monomer includes one of the following structures, -continued (XI), (XII), (XIII), (XIV), (XV), (XVI), (XVII), (XVIII), (XIX), (XX), (XXI), (XXII), (XXIII)

-continued (XXIV)
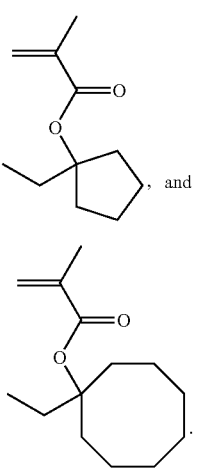
, and (XXV)

6. The positive photoresist composition of claim 1, further comprising:
 a third monomer unit derived from monomers comprising one of the following structures, (XXVI)
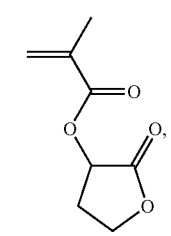

(XXVII)
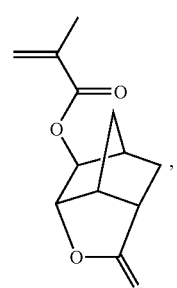

(XXVIII)
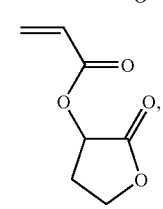

(XXIX)
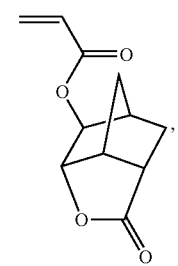

(XXX)
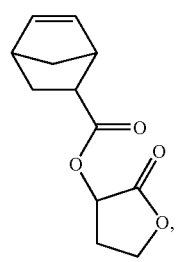

(XXXI)
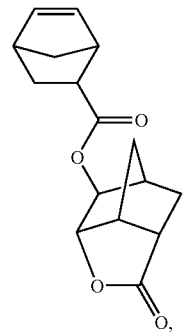

(XXXII)
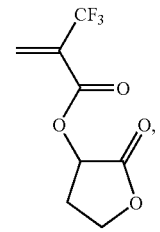

(XXXIII)
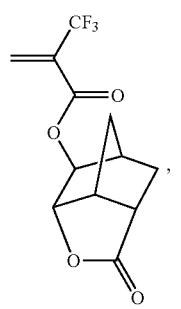

(XXXIV)
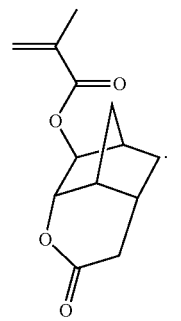

7. The positive photoresist composition of claim 1, wherein the radiation sensitive acid generator comprises at least one of an onium salt, a succinimide derivative, a diazo compound, and a nitrobenzyl compound.

8. The positive photoresist composition of claim 7, wherein the radiation sensitive acid generator comprises at least one of 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]- hept-5-ene-2,3-dicarboximide.

9. The positive photoresist composition of claim 1, further comprising at least one of a solvent, a quencher, and a surfactant.

10. The positive photoresist composition of claim 9, wherein the solvent comprises at least one of an ether, a glycol ether, an aromatic hydrocarbon, a ketone, and an ester.

11. The positive photoresist composition of claim 9, wherein the solvent comprises at least one of propylene glycol, monomethyl ether acetate, ethyl lactate, γ-butyrolactone, and cyclohexanone.

12. The positive photoresist composition of claim 9, wherein the quencher comprises at least one of an aromatic amine, an aliphatic amine, and a t-alkyl ammonium hydroxide.

13. The positive photoresist composition of claim 9, wherein the surfactant comprises at least one of a fluorine-containing surfactant and a siloxane-containing surfactant.

14. The positive photoresist composition of claim 9, wherein the positive photoresist composition comprises:
   about 1 to about 30 wt. % of the polymer;
   about 0.5 to about 20 wt. % of the acid generator, based on the total weight of the polymer; and
   about 70 to about 99 wt. % of the solvent.

15. The positive photoresist composition of claim 14, wherein the positive photoresist composition comprises:
   about 5 to about 15 wt. % of the polymer;
   about 0.5 to about 10 wt. % of the acid generator, based on the total weight of the polymer; and
   about 85 to about 95 wt. % of the solvent.

16. The positive photoresist composition of claim 14, wherein the positive photoresist composition further comprises:
   about 0.1 to about 1.0 wt. % of the quencher, based on the total weight of the polymer; and
   about 0.001 to about 0.1 wt. % of the surfactant, based on the total weight of the polymer.

* * * * *